(12) United States Patent
Ishibashi et al.

(10) Patent No.: US 6,448,768 B1
(45) Date of Patent: *Sep. 10, 2002

(54) MAGNETIC SENSOR WITH A SIGNAL PROCESSING CIRCUIT

(75) Inventors: Kazutoshi Ishibashi, Fuji (JP); Ichiro Shibasaki, Fuji (JP)

(73) Assignees: Asahi Kasei Electronics Co., Ltd. (JP); Asahi Kasei Kabushiki Kaisha (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/380,315
(22) PCT Filed: Feb. 27, 1998
(86) PCT No.: PCT/JP98/00841
§ 371 (c)(1),
(2), (4) Date: Aug. 27, 1999
(87) PCT Pub. No.: WO98/38519
PCT Pub. Date: Sep. 3, 1998

(30) Foreign Application Priority Data

Feb. 28, 1997 (JP) .............................................. 9-046376
Jun. 27, 1997 (JP) .............................................. 9-172114

(51) Int. Cl.[7] .......................... G01R 33/07; H01L 43/06; H03K 17/95
(52) U.S. Cl. .............. 324/251; 324/117 H; 324/207.12; 324/207.2; 324/225; 327/511
(58) Field of Search .......................... 324/207.12, 207.2, 324/207.21, 207.26, 166, 225, 251, 252, 117 R, 117 H, 173, 174; 307/116, 117; 327/510, 511; 338/32 R, 32 H

(56) References Cited

U.S. PATENT DOCUMENTS

| | | | |
|---|---|---|---|
| 4,371,837 A | | 2/1983 | Sieverin ...................... 324/225 |
| 5,231,351 A | * | 7/1993 | Kordts et al. ........ 324/207.12 X |
| 5,550,469 A | | 8/1996 | Tanabe et al. .............. 324/251 |
| 5,877,626 A | * | 3/1999 | Umemoto et al. .. 324/207.12 X |
| 6,100,680 A | * | 8/2000 | Vig et al. ................. 324/207.2 |

FOREIGN PATENT DOCUMENTS

| | | | |
|---|---|---|---|
| DE | 3827606 | 3/1989 | |
| JP | 61-226982 A | 10/1986 | ........... H01L/43/06 |
| JP | 01188016 | 7/1989 | |
| JP | 1-214784 A | 8/1989 | ........... G01R/33/06 |
| JP | 2-38920 A | 2/1990 | ............ G01D/3/04 |
| JP | 3-36979 | 4/1991 | |
| JP | 08139386 A | 5/1996 | ........... H01L/43/06 |
| JP | 08194040 A | 7/1996 | ........... G01R/33/07 |
| JP | 09054149 | 2/1997 | |

* cited by examiner

Primary Examiner—Gerard R. Strecker
(74) Attorney, Agent, or Firm—Pennie & Edmonds LLP

(57) ABSTRACT

A magnetic sensor with a signal processing circuit includes a magnetic sensor section 4 composed of a compound semiconductor thin film or a magnetic thin film, and a signal processing circuit 5 for amplifying a magnetic signal the magnetic sensor section detects as an electrical output. The signal processing circuit 5 includes an operational amplifier 51 and a constant current circuit 52 for carrying out feedback. The constant current circuit 52 in the signal processing circuit 5 includes a plurality of resistors with two or more different temperature coefficients, and the current output from the constant current circuit has a temperature coefficient inversely proportional to the temperature coefficient of the combined resistance of the plurality of the resistors.

11 Claims, 18 Drawing Sheets

MAGNETIC SENSOR WITH A SIGNAL PROCESSING CIRCUIT

TECHNICAL FIELD

The present invention relates to a magnetic sensor, and more particularly to a magnetic sensor with a signal processing circuit, which is usable as a sensor such as a proximity switch, current sensor, or encoder.

BACKGROUND ART

As a magnetic sensor with a signal processing circuit, a Hall IC is well known which employs a Hall element as its sensor. As a typical conventional Hall IC, a silicon (Si) monolithic Hall IC (referred to as "Si Hall IC" from now on) has a magnetic sensor section in the form of a Hall element made of silicon (Si), and a signal processing IC section for processing a signal detected by the magnetic sensor section.

This type of the magnetic sensor has a low sensitivity to magnetic field because the magnetic sensor section of the Si Hall IC consists of the Hall element made of Si with a small electron mobility. Therefore, to operate the Hall IC as a magnetic sensor, large magnetic field must be applied to it. In other words, the Hall IC has a problem of a low sensitivity to magnetic field.

In addition, it is known that Si generates some voltage when mechanical stress is applied from outside.

Thus, the Si Hall IC has another problem of varying its sensitivity to magnetic field because of the voltage generated in the Hall element of the magnetic sensor section when external stress is applied.

Such problems must be considered when fabricating highly accurate, highly reliable proximity switches, current sensors or encoders by using the Si Hall IC.

Therefore, a magnetic sensor with a signal processing circuit is desired which can achieve accurate detection of a magnet position or magnetic field strength with a high sensitivity independent of external stress and with stable characteristics. Such a magnetic sensor has not yet been realized because of great difficulty.

On the other hand, various methods are studied to achieve highly accurate detection of the magnet position or magnetic field strength. For example, sensors, which use a Hall element as their magnetic sensor and include a signal processing circuit composed of discrete components such as an operational amplifier or resistors, are applied to the proximity switches, current sensors or encoders.

In these methods, however, users are required to have special technical expertise to understand the characteristics of the sensor, to implement optimum circuit design, and to acquire discrete components and assemble them. In addition, it is unavoidable that their cost and size increase because the sensors are implemented by mounting on a circuit board the magnetic sensor element and the signal processing circuit consisting of the discrete components. The cost and size increase presents a critical problem in the field of sensors that requires low cost and small size.

For example, in a conventional technique as shown in FIG. 12 of Japanese Patent Application Laid-open No. 38920/1990, the signal processing circuit comprises magnetoresistive elements 60 and 70 constituting a discrete magnetic sensor, resistors 6, 7 and 7' and an operational amplifier 51. The feedback resistance is composed of the combined resistance of the resistors 6, 7 and 7' with different temperature coefficients to form a feedback loop from the output terminal of the operational amplifier 51 to its inverting input terminal, thereby implementing magnetic characteristics with a desired temperature characteristic. This circuit configuration, however, has the foregoing problem of increasing the cost and size. Besides, the circuit configuration has another problem of decreased yield when obtaining an intended output because of the variations of the output voltage due to the variations in the midpoint potential of the magnetoresistive elements 60 and 70. Furthermore, since the midpoint potential usually drifts in accordance with temperature, the drift appears in the output voltage of the circuit, and has an adverse effect on the temperature characteristic of the output signal of the sensor. Thus, it is difficult for conventional circuits to obtain the desired temperature characteristic.

In addition, although the configuration of FIG. 12 can freely use the discrete resistors 6, 7 and 7' with different temperature coefficients to implement the magnetic characteristics with the desired temperature characteristic, it discloses nothing about the implementation of a circuit like the Si monolithic IC.

Still another problem arises in that a common conventional Si Hall IC as shown in FIG. 14, which includes a signal processing circuit section 20a and a magnetic sensor section 30a that are electrically isolated from a substrate 21a only through the PN junction, for example, cannot perform stable operation in an ambient temperature above 125° C., and cannot operate at all beyond 150° C.

On the other hand, a technique is known which improves the temperature characteristics by reflecting the temperature dependence of the output resistance of a Hall element to a threshold voltage by employing the output resistance of the Hall element as the input resistance of a Schmitt trigger circuit. Specifically, in a circuit configuration as shown in FIG. 12, the threshold voltage Vth of the Schmitt trigger circuit is expressed as $Vth=(Vdo-V1) \cdot Rho/RF$, where V1 is the potential at the inverting input terminal of the operational amplifier 51; RF is the feedback resistance; Vdo is the output potential of the amplified output signal 18 of the operational amplifier 51; and Rho is half the output resistance of the Hall element 4 (Japanese Patent Application Laid-open No. 226982/1986).

Here, the potential V1 causes a problem. Since the potential V1, which is the output potential of the Hall element 4, is about half the product of the input resistance Rhi of the Hall element 4 and the Hall element driving current Ic, the variations in Rhi causes the variations in V1. This in turn causes the variations in Vth, which makes it impossible to establish the threshold voltage exactly at a value designed. This results in the Hall IC with magnetic characteristics different from those designed, thereby reducing the yield.

The potential at the output terminal of the Hall element 4, which equals about half the input voltage to the Hall element, is referred to as a midpoint potential of the Hall element. The value has certain distribution due to the production variations of the Hall elements. The variations in the midpoint potential also cause the variations of V1, resulting in the reduction in the yield.

DISCLOSURE OF THE INVENTION

The inventors of the present invention intensively conducted the research to implement practical magnetic sensors capable of solving the foregoing problems of the magnetic sensor.

We aim to fabricate a highly sensitive, stable operation magnetic sensor with a signal processing circuit by forming the magnetic sensor with a structure of isolating the magnetic sensor section from the signal processing circuit consisting of a Si IC.

To implement a highly sensitive magnetic sensor with a signal processing circuit with stable operation characteristics, we study a magnetic sensor with a signal processing circuit that combines the signal processing circuit with a highly sensitive magnetic sensor composed of a compound semiconductor thin film or a magnetic thin film, which has a higher sensitivity in the magnetic field than the Si Hall element and can provide a stable magnetic sensor output independently of the mechanical external stress.

As a result, the inventors of the present invention invented a hybrid Hall IC which employed the compound semiconductor as the sensor, and combined it with a Si monolithic IC to be packed in a single package.

The present invention can implement a versatile, inexpensive, small size, high performance magnetic sensor with a signal processing circuit that does not require users to have any technical expertise such as special circuit technique, thereby making it possible to achieve detection of a magnet position or magnetic field strength at high accuracy.

In contrast with this, the conventional techniques cannot avoid the reduction in the yield of the Hall ICs because of the variations involved in producing the Hall elements or ICs. In addition, it cannot solve a problem of an increase in cost for improving the accuracy of circuit components of the ICs.

Furthermore, there is another problem in that as the temperature rises, the resistance increases of the compound semiconductor thin film or magnetic thin film constituting the magnetic sensor, and the output of the magnetic sensor reduces. Therefore, the magnetic sensor, when combined with the signal processing circuit without any change, has a problem of reducing the output of the magnetic sensor with a signal processing circuit as the temperature rises, that is, a problem of large dependence on temperature. This causes a critical problem in implementing highly accurate, practical detection because a magnet, a common object to be detected by the magnetic sensor with a signal processing circuit, has an inclination to reduce its magnetic flux density as the temperature rises.

The inventors of the present invention conducted researches to solve the problems.

The present invention is implemented to solve the problems, that is, to provide a magnetic sensor with a signal processing circuit without being affected from the magnetic sensor side. In other words, an object of the present invention is to prevent the reduction in the yield of the Hall IC due to the variations involved in producing the Hall elements or the variations in ICs, and to make it possible to reduce the number of components in the IC circuit and the demand for the accuracy, thereby achieving the improvement in the yield and reducing the cost.

Another object of the present invention is to implement a high performance magnetic sensor with a signal processing circuit having little dependence on temperature over a wide temperature range by correcting the temperature coefficients of the resistors and sensitivity of the magnetic sensor with a simple structure. Still another object of the present invention is to implement a high performance magnetic sensor with a signal processing circuit that can reduce the dependence of the sensor output on the temperature even if the magnetic field to be detected has large dependence on temperature as in the case of detecting the magnetic field of a permanent magnet.

In the first aspect of the present invention, there is provided a magnetic sensor with a signal processing circuit comprising:

a magnetic sensor section composed of one of a compound semiconductor thin film and a magnetic thin film; and a signal processing circuit for amplifying a magnetic signal the magnetic sensor section detects as an electrical output, wherein the signal processing circuit includes an operational amplifier and a constant current circuit for carrying out feedback.

Here, the constant current circuit may feed a different current value corresponding to an output of the operational amplifier back to an non-inverting input terminal of the operational amplifier.

The constant current circuit may include a plurality of resistors with at least two different temperature coefficients, and the current the constant current circuit outputs may have a temperature coefficient which is inversely proportional to a temperature coefficient of a combined resistance of the plurality of the resistors.

The combined resistance of the plurality of resistors may have a temperature coefficient that corrects a temperature coefficient of an internal resistance of the magnetic sensor section and a temperature coefficient of sensitivity of the magnetic sensor section.

The plurality of resistors may have temperature coefficients that correct not only the temperature coefficient of the internal resistance of the magnetic sensor section and the temperature coefficient of the sensitivity of the magnetic sensor section, but also a temperature coefficient of an object to be detected by the magnetic sensor section.

The signal processing circuit may be a monolithic IC.

The signal processing circuit may be formed on one of an insulated substrate and an insulating layer formed on a semiconductor substrate.

According to the second aspect of the present invention, a magnetic sensor with a signal processing circuit is provided that comprises:

a magnetic sensor section composed of one of a compound semiconductor thin film and a magnetic thin film; and a signal processing circuit for amplifying a magnetic signal the magnetic sensor section detects as an electrical output, wherein the signal processing circuit includes an operational amplifier and a constant current circuit for carrying out feedback, and is a monolithic IC.

The constant current circuit may feed a different current value corresponding to an output of the operational amplifier back to a non-inverting input terminal of the operational amplifier. Moreover, the constant current circuit includes a plurality of resistors with at least two different temperature coefficients. The current that the constant current circuit outputs has a temperature coefficient which is inversely proportional to a temperature coefficient of a combined resistance of the plurality of the resistors.

The combined resistance of the plurality of resistors has a temperature coefficient that corrects a temperature coefficient of an internal resistance of the magnetic sensor section and a temperature coefficient of sensitivity of the magnetic sensor section. The plurality of resistors have temperature coefficients that correct not only the temperature coefficient of the internal resistance of the magnetic sensor section and the temperature coefficient of the sensitivity of the magnetic sensor section, but also a temperature coefficient of an object to be detected by the magnetic sensor section.

According to the third aspect of the present invention, a magnetic sensor with a signal processing circuit comprising:

a magnetic sensor section composed of one of a compound semiconductor thin film and a magnetic thin film; and a signal processing circuit for amplifying a magnetic signal the magnetic sensor section detects as an electrical output, wherein the signal processing circuit includes an operational amplifier and a constant current circuit for carrying out feedback, and is formed on one of an insulated substrate and an insulating layer formed on a semiconductor substrate.

The constant current circuit may feed a different current value corresponding to an output of the operational amplifier back to a non-inverting input terminal of the operational amplifier. Moreover, the constant current circuit includes a plurality of resistors with at least two different temperature coefficients. The current that the constant current circuit outputs has a temperature coefficient which is inversely proportional to a temperature coefficient of a combined resistance of the plurality of the resistors.

The combined resistance of the plurality of resistors has a temperature coefficient that corrects a temperature coefficient of an internal resistance of the magnetic sensor section and a temperature coefficient of sensitivity of the magnetic sensor section. The plurality of resistors have temperature coefficients that correct not only the temperature coefficient of the internal resistance of the magnetic sensor section and the temperature coefficient of the sensitivity of the magnetic sensor section, but also a temperature coefficient of an object to be detected by the magnetic sensor section.

According to the fourth aspect of the present invention, a magnetic sensor with a signal processing circuit comprising:

a magnetic sensor section composed of one of a compound semiconductor thin film and a magnetic thin film; and a signal processing circuit for amplifying a magnetic signal the magnetic sensor section detects as an electrical output, wherein the signal processing circuit includes an operational amplifier and a constant current circuit for carrying out feedback, and is a monolithic IC, and is formed on one of an insulated substrate and an insulating layer formed on a semiconductor substrate.

In the fifth aspect of the present invention, there is provided a magnetic sensor with a signal processing circuit comprising:

a magnetic sensor section composed of one of a compound semiconductor thin film and a magnetic thin film; and a signal processing circuit for amplifying a magnetic signal the magnetic sensor section detects as an electrical output, wherein the signal processing circuit includes a plurality of feedback resistors with at least two different temperature coefficients, and the plurality of resistors feed an output of an operational amplifier back to its non-inverting input terminal.

Here, the magnetic sensor with a signal processing circuit in accordance with the present invention has the magnetic sensor section consisting of a compound semiconductor thin film, which can be any type of magnetic sensor that utilizes the Hall effect, magnetoresistance effect, or magnetic thin film based magnetoresistance effect. It is particularly preferable to utilize Hall elements or magnetoresistive elements which are composed of InAs (indium arsenic), GaAs (gallium arsenic), InGaAs (indium gallium arsenic), InSb (indium antimony), InGaSb (indium gallium antimony), etc., or magnetic thin film magnetoresistive elements composed of NiFe (nickel iron), NiCo (nickel cobalt), etc., or the magnetic sensors combining them.

Here, the compound semiconductor thin film refers to a thin film formed on a substrate by a common process technique of the semiconductor such as CVD (chemical vapor deposition), MBE (molecular beam epitaxy), vacuum evaporation, or sputtering, or to a thin film formed by shaving a semiconductor ingot, or to an active layer formed on the surface of a semiconductor substrate by ion implantation or diffusion.

The signal processing circuit of the magnetic sensor with a signal processing circuit in accordance with the present invention can be a common circuit produced with microstructure. A circuit integrated on a Si substrate is preferable regardless of whether the circuit components have the MOS structure, bipolar structure, or hybrid structure thereof. Furthermore, as long as having the signal processing function, a circuit integrated on a GaAs substrate is also preferable. Moreover, a micro-structure circuit with a small size formed on a ceramic substrate is preferable, as well.

The foregoing plurality of resistors can have temperature coefficients that can correct not only the temperature coefficient of the internal resistance of the magnetic sensor section and the temperature coefficient of the sensitivity, but also the temperature coefficient of the object to be detected by the magnetic sensor section.

The signal processing circuit of the magnetic sensor of the signal processing circuit can be a circuit fabricated in micro-structure. For example, it can have such a structure that the circuit is formed on an insulated substrate like a circuit formed on a ceramic substrate. Alternatively, the signal processing circuit can be a circuit integrated on an insulating layer or high-resistance layer formed on a Si substrate. It can also be structured integrally with the semiconductor or ferromagnetic sensor formed on the surface of an IC.

The insulated substrate, insulating layer, or high-resistance layer refers to a substrate or a layer with a resistivity of equal to or more than 10 raised to the fifth to seventh power $\Omega \cdot$ cm excluding the PN junction insulation structure, such as a substrate or layer made of ceramic, silicon oxide or alumina.

BEST MODE FOR CARRYING OUT THE INVENTION

The embodiments in accordance with the present invention will now be described with reference to the accompanying drawings.

EMBODIMENT 1

Figure 1:
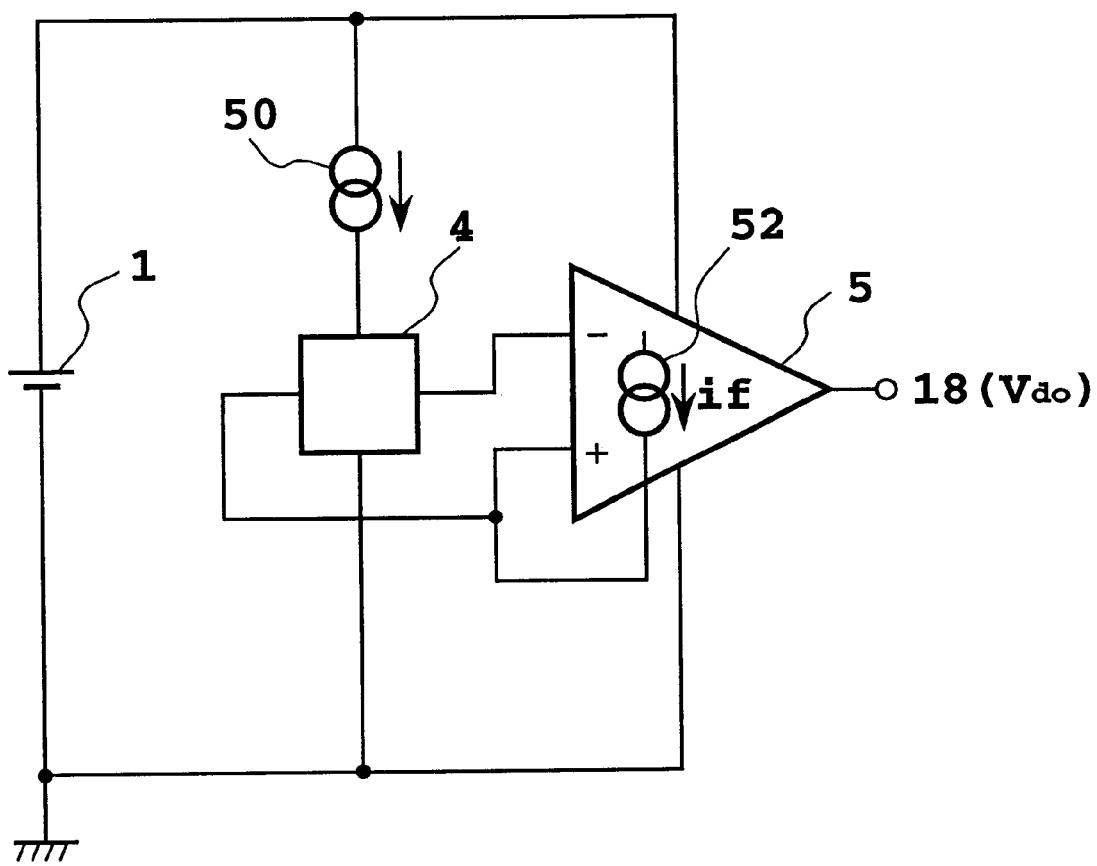
FIG. 1 is a circuit diagram showing a first embodiment in accordance with the present invention.

In the embodiment as shown in FIG. 1, a voltage source 1 drives a signal processing circuit 5, and a Hall element 4 through a constant current source 50. The two output terminals of the Hall element 4 are connected to the inverting input terminal and non-inverting input terminal of an operational amplifier in the signal processing circuit 5. Besides, a constant current $i_f$ fed from a constant current circuit 52 in the signal processing circuit 5 is fed back to the non-inverting input terminal of the operational amplifier. With such an arrangement, the present embodiment forms a Schmitt trigger circuit, that is, a digital processing circuit.

In the embodiment of FIG. 1, since the feedback consists of the constant current $i_f$ fed from the constant current source rather than the resistance RF, the threshold voltage Vth of the digital processing circuit is expressed as Vth= Rho$x_{if}$, where Rho is about half the Hall element output resistance. Accordingly, threshold voltage Vth is free from the effect of the potential V1 at the inverting input terminal of the operational amplifier. This means that the threshold voltage Vth is unaffected by the variations in the input resistance of the Hall element 4 or the variations in the midpoint potential, thereby implementing the designed magnetic characteristics and improving the yield markedly.

Figure 16:
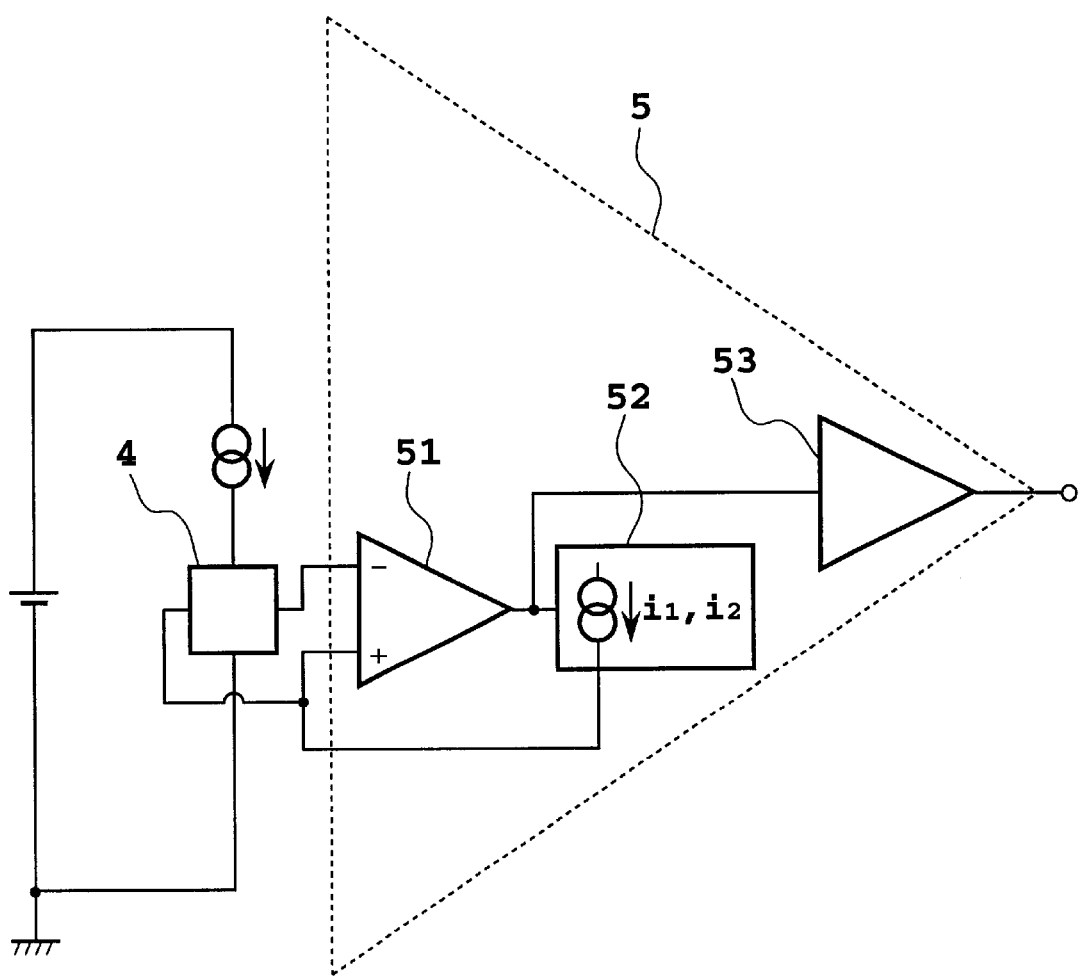
FIG. 16 is a diagram showing a detail of an amplifier in the signal processing circuit in accordance with the present invention.
Figure 18:
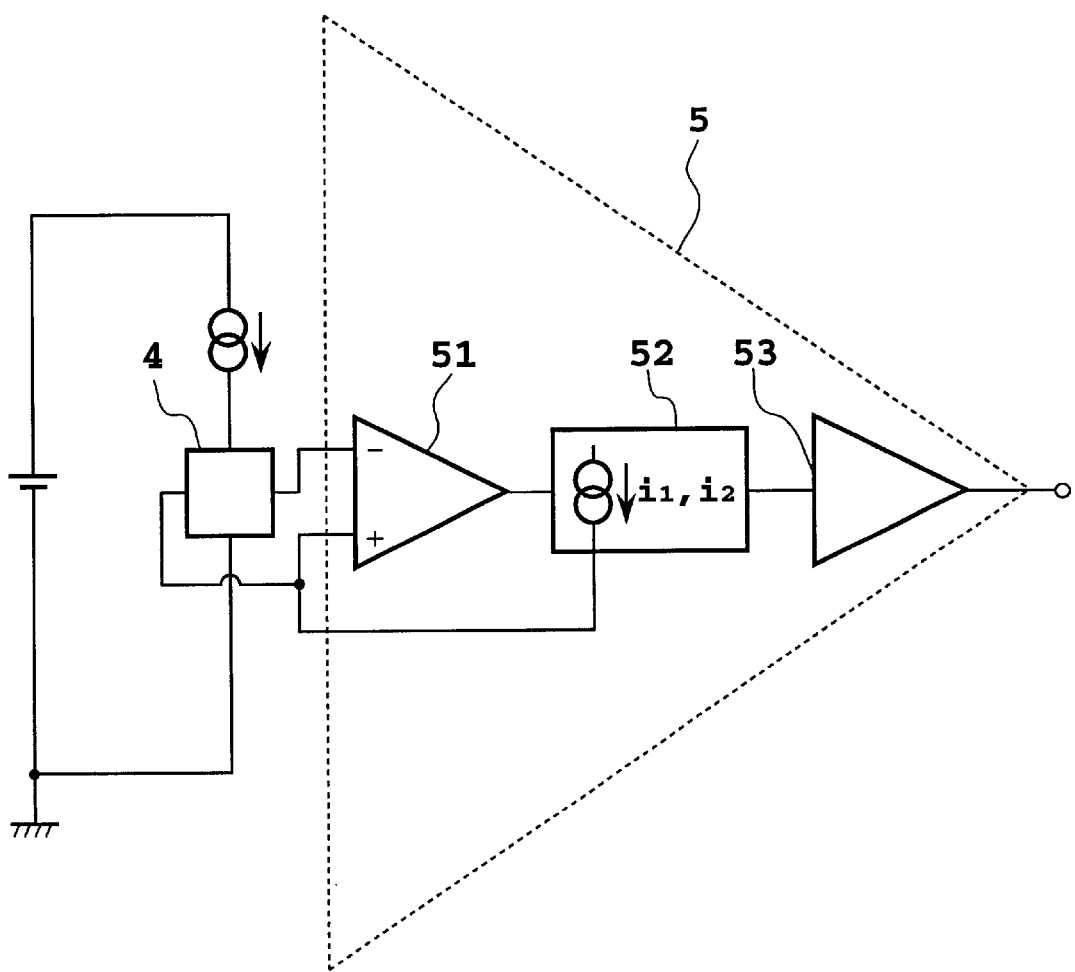
FIG. 18 is a diagram showing another detail of the amplifier in the signal processing circuit in accordance with the present invention.

The detailed structure of the signal processing circuit as shown in FIGS. 1–5 will now be described by way of example of the structures as shown in FIGS. 16 and 18.

In FIG. 16, reference numeral 5 designates the signal processing circuit comprising the operational amplifier 51, the constant current circuit 52 and a buffer circuit 53. The inverting input terminal and non-inverting input terminal of the operational amplifier 51 are connected to the two output terminals of the Hall element 4 so that the output resistance of the Hall element 4 serves as the input resistance of the operational amplifier 51. In response to the output of the operational amplifier 51, the constant current circuit 52 can output one of the two constant current values i1 and i2 (i1>i2), and feeds the output current back to the non-inverting input terminal of the operational amplifier 51. More specifically, the constant current circuit 52 outputs i1 when the output of the operational amplifier 51 is "High", and i2 when the output of the operational amplifier 51 is "Low" to achieve the positive feedback so that the operational amplifier 51 and he constant current circuit 52 function as a Schmitt trigger circuit. The buffer circuit 53 extracts the output of the operational amplifier 51 without disturbing the operation of the Schmitt trigger circuit composed of the operational amplifier 51 and constant current circuit 52. FIG. 18 shows another example of the signal processing circuit 5 composed of the operational amplifier 51, constant current circuit 52 and buffer circuit 53 connected in cascade, whose operation is the same as that of FIG. 16.

EMBODIMENT 2

Figure 3:
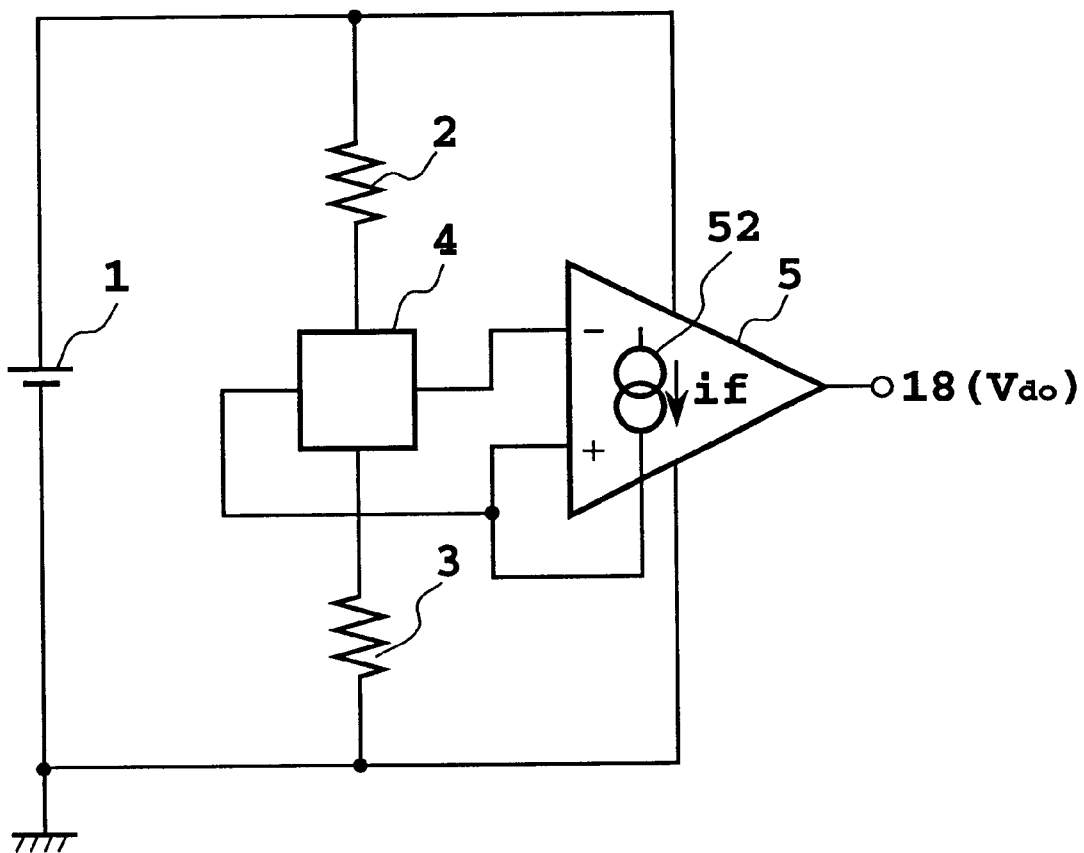
FIG. 3 is a circuit diagram showing a second embodiment in accordance with the present invention.
Figure 4:
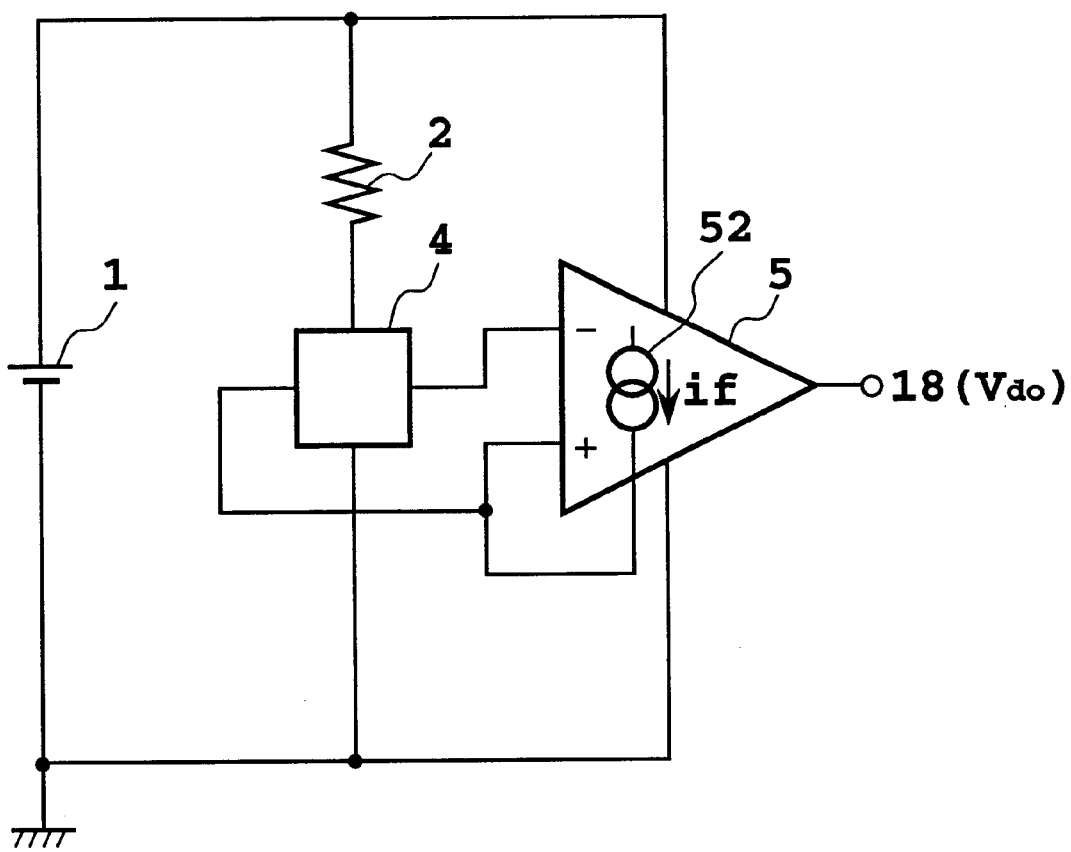
FIG. 4 is a circuit diagram showing a variation of a third embodiment in accordance with the present invention.
Figure 5:
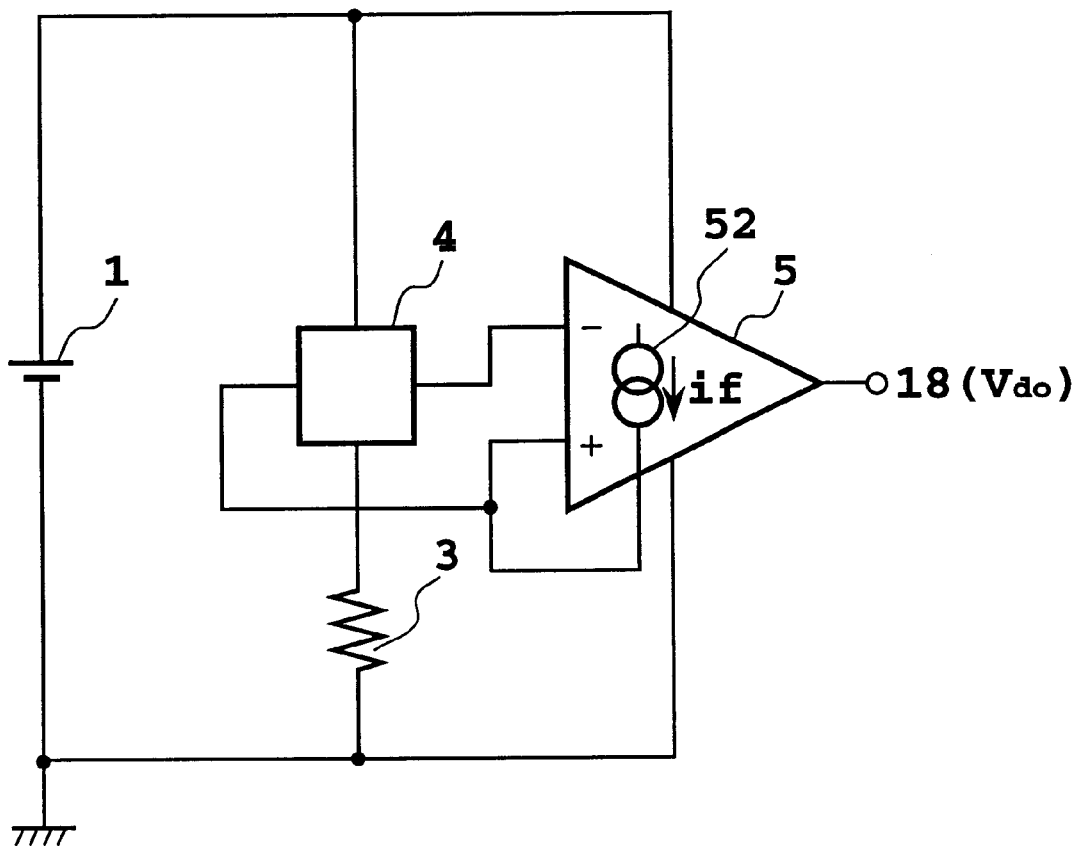
FIG. 5 is a circuit diagram showing a variation of a fourth embodiment in accordance with the present invention.

FIGS. 3–5 show different configurations of the embodiments in accordance with the present invention.

FIG. 3 shows a circuit configuration in which the Hall element 4 is sandwiched between a pair of driving resistors 2 and 3 at its top and bottom, which are used in place of the Hall element driving constant current source 50 as shown in FIG. 1. It is not necessary to match the resistance values of the resistors 2 and 3 because they are free from the effect of V1. This can obviate the relative accuracy of the resistors, thereby offering an advantage of being able to prevent the reduction in the yield when forming the magnetic sensor in a monolithic IC.

EMBODIMENTS 3 and 4

FIG. 4 shows a circuit configuration in which the driving resistor 2 is connected to only the plus side of the input of the Hall element 4; and FIG. 5 shows a circuit configuration in which the driving resistor 3 is connected to only the minus side of the input of the Hall element 4. The configurations as shown in FIGS. 3–5 can each achieve similar effect to that of the configuration as shown in FIG. 1.

EMBODIMENT 5

Figure 6:
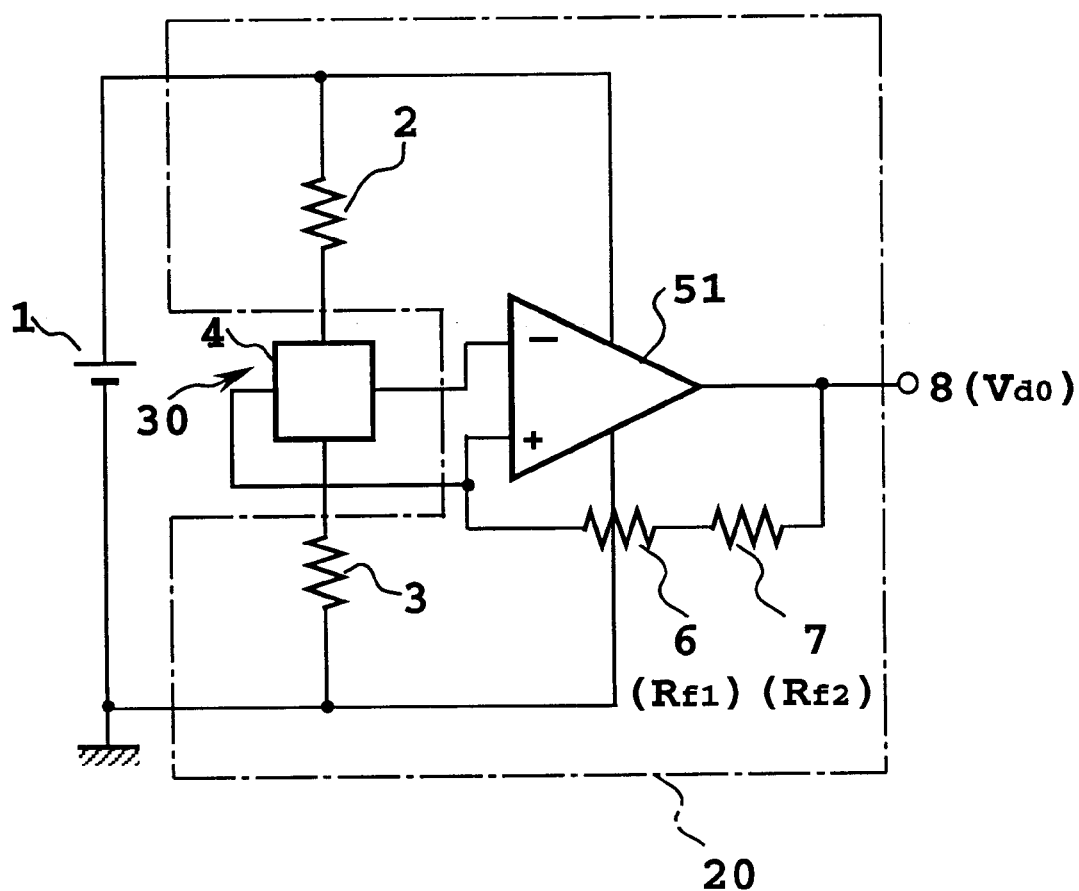
FIG. 6 is a circuit diagram showing a fifth embodiment in accordance with the present invention.

FIG. 6 shows a fifth example in accordance with the present invention. It is an example of the signal processing circuit for implementing a high performance magnetic sensor with a signal processing circuit that can stabilize the output by reducing the temperature dependence of the output signal to approximately zero in a wide temperature range. The present invention makes it possible to obtain the sensor output independent of the temperature even when detecting the magnetic field with considerable temperature dependence like the magnetic field of a permanent magnet.

In the present embodiment, resistors 6 and 7 are connected in series across the output signal after the amplification by the operational amplifier 51 and the non-inverting input terminal, as a digital signal processing feedback resistance. This forms a Schmitt trigger circuit (which may be simply called "digital processing circuit" from now on) with a threshold voltage proportional to the feedback quantity.

Figure 8:
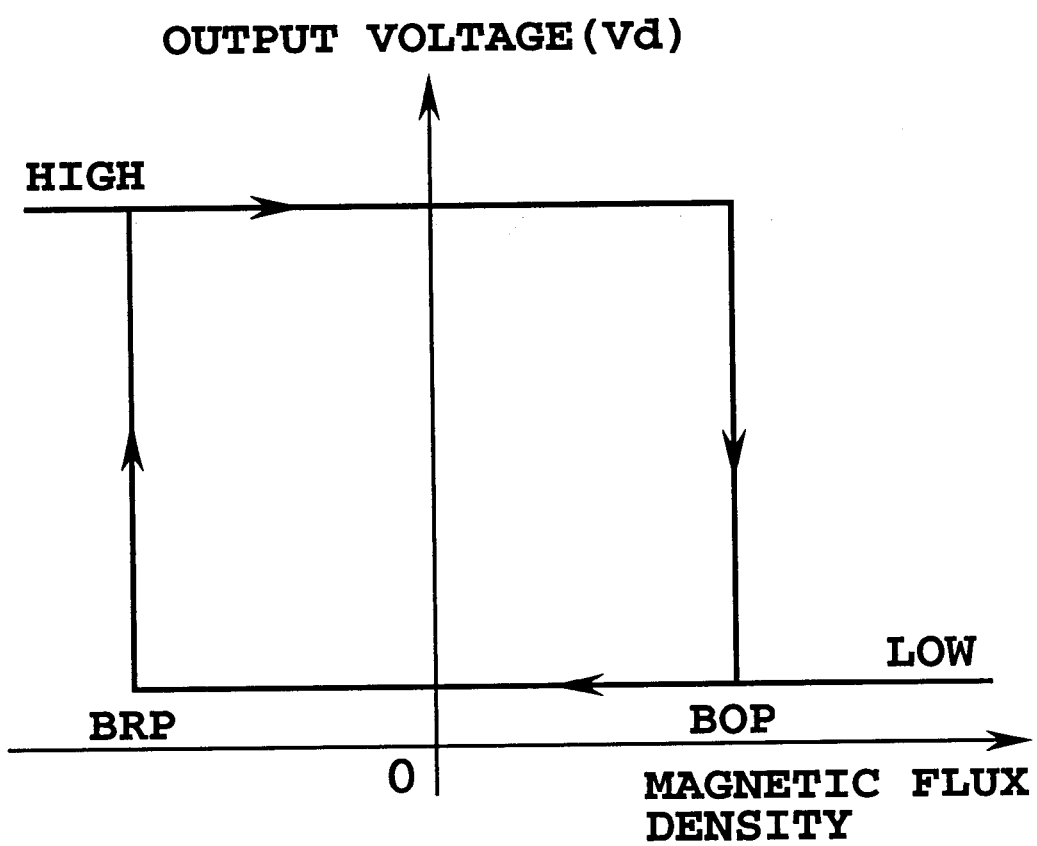
FIG. 8 is a characteristic diagram illustrating relationships between the output voltage after digital conversion and applied magnetic flux density.

Thus, the operational amplifier 51 has a maximum output voltage when the voltage at the non-inverting input terminal is higher than the voltage at the inverting input terminal, and a minimum output voltage in the opposite case, thereby operating as a comparator. FIG. 8 is a diagram illustrating the relationships between the output voltage (Vdo) after the digital conversion and the magnetic flux density applied to the Hall element. The magnetic flux density at which the output voltage varies from high to low is referred to as operating magnetic flux density (Bop), whereas the magnetic flux density at which the output voltage changes from low to high is called return magnetic flux density (Brp).

As shown in FIG. 6, the voltage source 1 drives the operational amplifier 51 and the InAs Hall element 4 through the driving resistors 2 and 3. The InAs Hall element constitutes a magnetic sensor section 30. The output resistance of the InAs Hall element 4 serves as the input resistance of the operational amplifier 51 so as to form a Schmitt trigger circuit with a pair of feedback resistors 6 and 7 (Rf1 and Rf2) with different temperature coefficients, which are fed back to the non-inverting input terminal of the operational amplifier 51. With such an arrangement, the threshold voltage is expressed as Vth=(Vdo−V1)·Rho/(Rf1+Rf2). The signal processing circuit section 20 is composed of the driving resistors 2 and 3, operational amplifier 51 and resistors 6 and 7. When the effect of V1 is negligible, setting the resistance values of Rf1 and Rf2 at appropriate values can adjust the temperature coefficient of Vth. This makes it possible to correct the temperature coefficients of both the internal resistance and sensitivity of the InAs Hall element 4, thereby enabling the Bop and Br to have any desired temperature coefficient. The resistors 6 and 7 can also be connected in parallel.

In this way, the sensor output without the temperature dependence with respect to the magnetic field can be obtained.

In addition, since the temperature coefficient of a permanent magnet can be measured in advance, even if the magnetic field to be detected has the temperature dependence like the magnetic field of the permanent magnet, adjusting the ratio of the resistance values of Rf1 and Rf2 enables the temperature coefficient of the permanent magnet to be corrected, thereby making it possible to eliminate the temperature dependence of the sensor output.

Although the InAs Hall element is used as the magnetic sensor in the fifth embodiment, a magnetic thin film magnetoresistive element (NiFe) is usable in place of it.

EMBODIMENT 6

Figure 2:
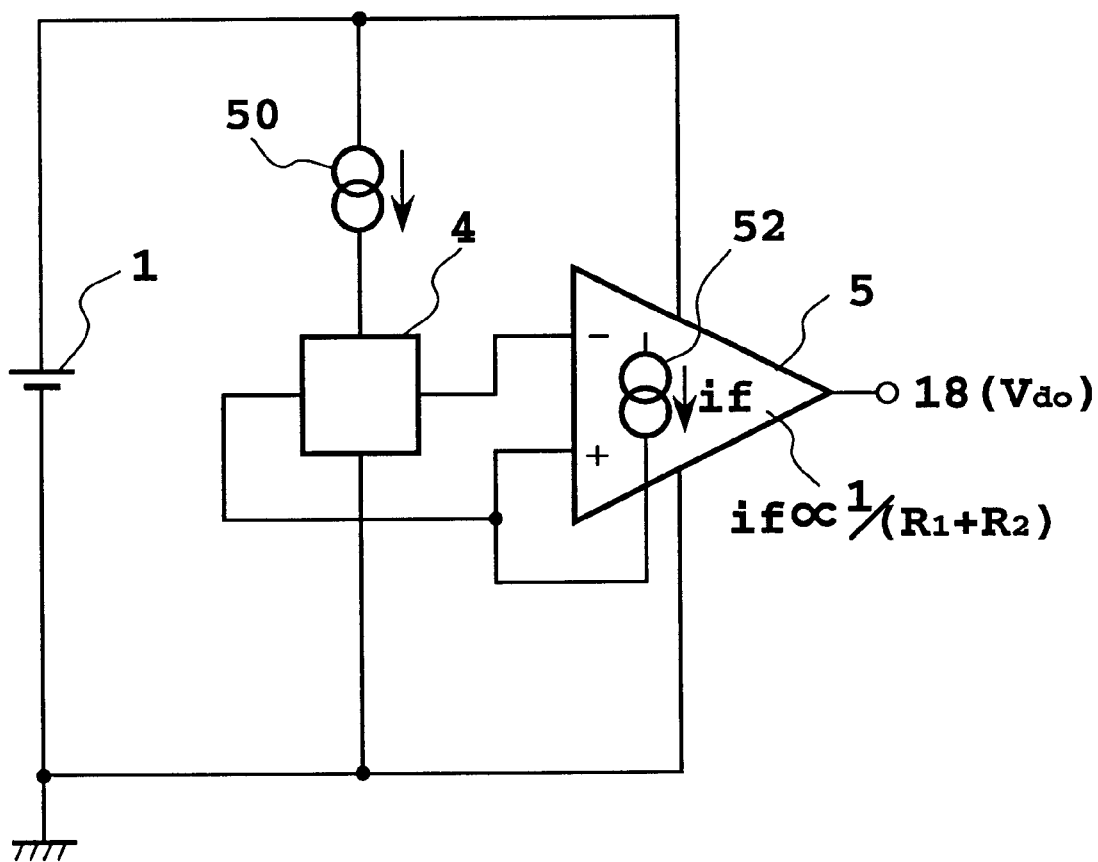
FIG. 2 is a circuit diagram showing a sixth embodiment in accordance with the present invention.
Figure 17:
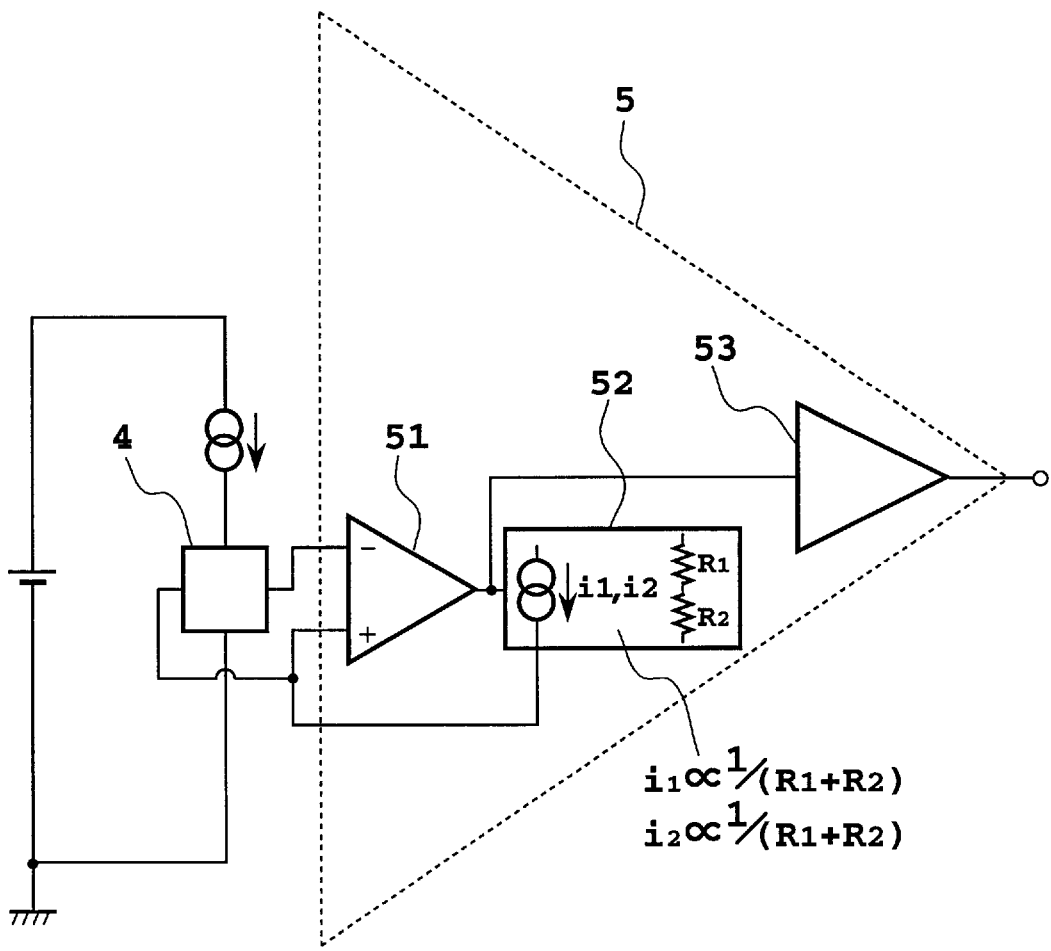
FIG. 17 is a diagram showing the details of the circuit diagram of FIG. 16.

FIG. 2 shows a sixth example in accordance with the present invention, and FIG. 17 shows a detailed structure of its signal processing circuit. As part of a structural component for determining the two constant current values i1 and i2 are applied a plurality of resistors (two resistors R1 and R2 in this case) with different temperature coefficients in the signal processing circuit 51, particularly in the constant current circuit 52, so that the two or more constant current values i1 and i2 are inversely proportional to the temperature coefficient of the combined resistance of the resistors R1 and R2 with the different temperature coefficients, which are connected in series or in parallel or in a combination thereof, that is, i1 1/(R1+R2) and i2 1/(R1+R2), thereby making it possible to provide any desired temperature coefficient such as Vth1=Rho×i1 and Vth2=Rho×i2. In addition to the effect of FIG. 6, this can eliminate the influence of V1, and hence can ensure that the output signal of the signal processing circuit 5 has any desired temperature coefficient such as the temperature coefficient for correcting the temperature coefficients of both the internal resistance and sensitivity of the magnetic sensor section 4, or the temperature coefficient for correcting the temperature coefficient of the object to be detected by the magnetic sensor section.

Although the circuit configurations of the foregoing embodiments can each realize their signal processing circuit section using a Si monolithic IC, resistance implemented by a common Si monolithic IC can include both a low sheet resistance with a rather low temperature coefficient, and a high sheet resistance with a rather high temperature coefficient. In the Si monolithic IC, the difference in the temperature coefficients has long been considered as a negative factor or an unacceptable characteristic in the circuit technique. The present invention, however, positively utilizes the difference to create the desired temperature coefficient in the form of the combined resistance composed of a series or parallel connection, or the combination of the series and parallel connections. This makes it possible to generate the constant current to be fed back, which is inversely proportional to the temperature coefficient, thereby implementing in the Si monolithic IC the magnetic sensor with a signal processing circuit having a temperature coefficient of any desired magnetic characteristics, which has been conventionally considered as impossible.

EMBODIMENT 7

The operation of the circuit elements in the signal processing circuit section formed in a common Si IC have been considered to be unstable at high temperatures beyond 125° C. because they are formed in the surface of the Si substrate with a structure which electrically isolates them from the substrate by the PN junction, and the current leakage of the PN junction for the isolation increases at high temperatures. In view of this, we form the circuit elements on the surface of an insulated substrate, as a circuit configuration with a small leakage current to the substrate. As a result, we found that the leakage current to the substrate has large effect on the stable operation at the high temperatures.

The present embodiment employs a signal processing circuit with the structure that can reduce the leakage current to the substrate, and arranges the magnetic sensor by combining the signal processing circuit with a compound semiconductor magnetic sensor or with a magnetic thin film magnetoresistive element.

Figure 11A:
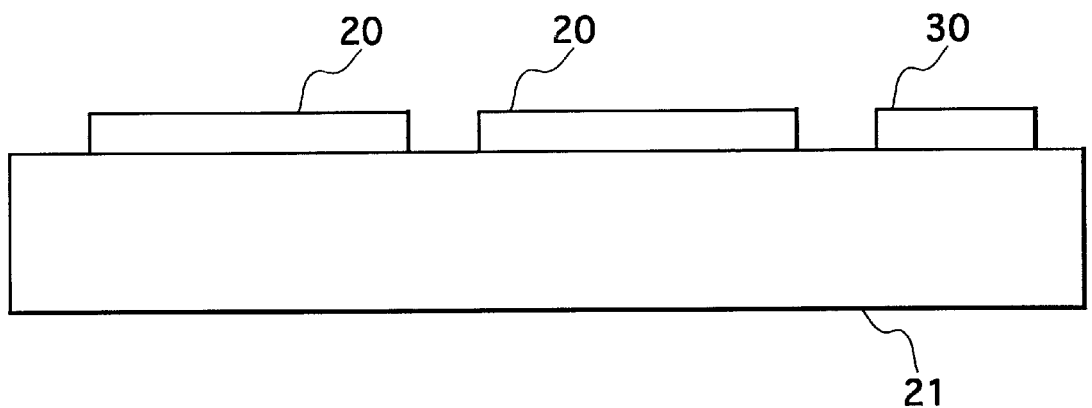
FIG. 11A is a cross-sectional view showing a substrate structure including the signal processing section of FIGS. 1–5.

FIG. 11A shows a structure of a substrate including the signal processing circuit section 20 as shown in each of FIGS. 1–6. The integrated circuit of the signal processing circuit section 20 has a structure formed on an insulated ceramic substrate. In other words, the semiconductor circuit elements as the signal processing circuit section 20 are formed on an insulated substrate 21. Such a structure enables a stable operation in the high ambient temperature.

Furthermore in FIG. 11A, a magnetic sensor section 30 is formed on the insulated substrate 21 on which the signal processing circuit section 20 is formed. The magnetic sensor 30 can also be formed on the signal processing circuit section 20 via an insulating layer, or formed on a substrate other than the insulated substrate 21.

EMBODIMENT 8

Figure 11B:
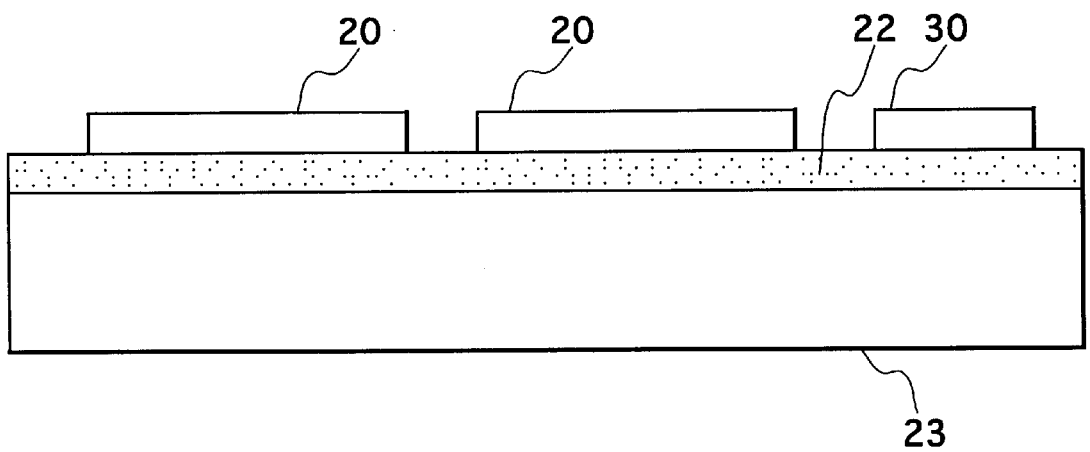
FIG. 11B is a cross-sectional view showing another substrate structure.
Figure 12:
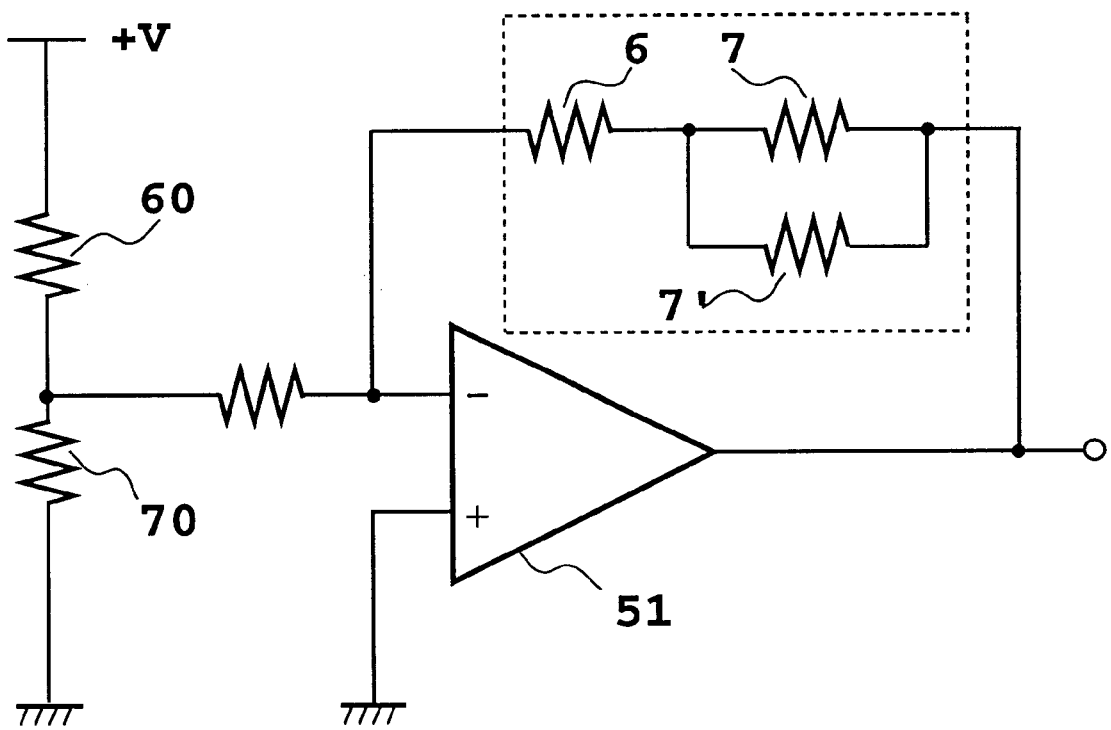
FIG. 12 is a diagram showing a conventional signal processing circuit for comparison.

FIG. 11B shows another example of the substrate structure including the signal processing circuit section 20. An insulating layer 22 such as $SiO_2$ is formed on a Si substrate 23, and the semiconductor circuit elements are formed on the insulating layer 22 as the signal processing circuit section 20. The structure also offers an advantage of being able to achieve stable operation at high temperatures.

In FIG. 11B, the magnetic sensor section 30 is formed on the insulating layer 22 of the Si substrate 23, on which the signal processing circuit section 20 is formed. The magnetic sensor 30 can also be formed on the signal processing circuit section 20 via an insulating layer, or formed on a substrate other than the Si substrate 23.

The circuit configuration as shown in FIG. 11A or 11B enables the stable signal processing operation up to the temperature 175° C., which has been impossible previously. This makes it possible to implement a highly accurate, highly reliable magnetic sensor with an amplifier.

Next, some experimental results will be shown which comparatively studied the foregoing embodiments in accordance with the present invention with the conventional one.

EXPERIMENTAL EXAMPLES

Experimental Example 1

Figure 7:
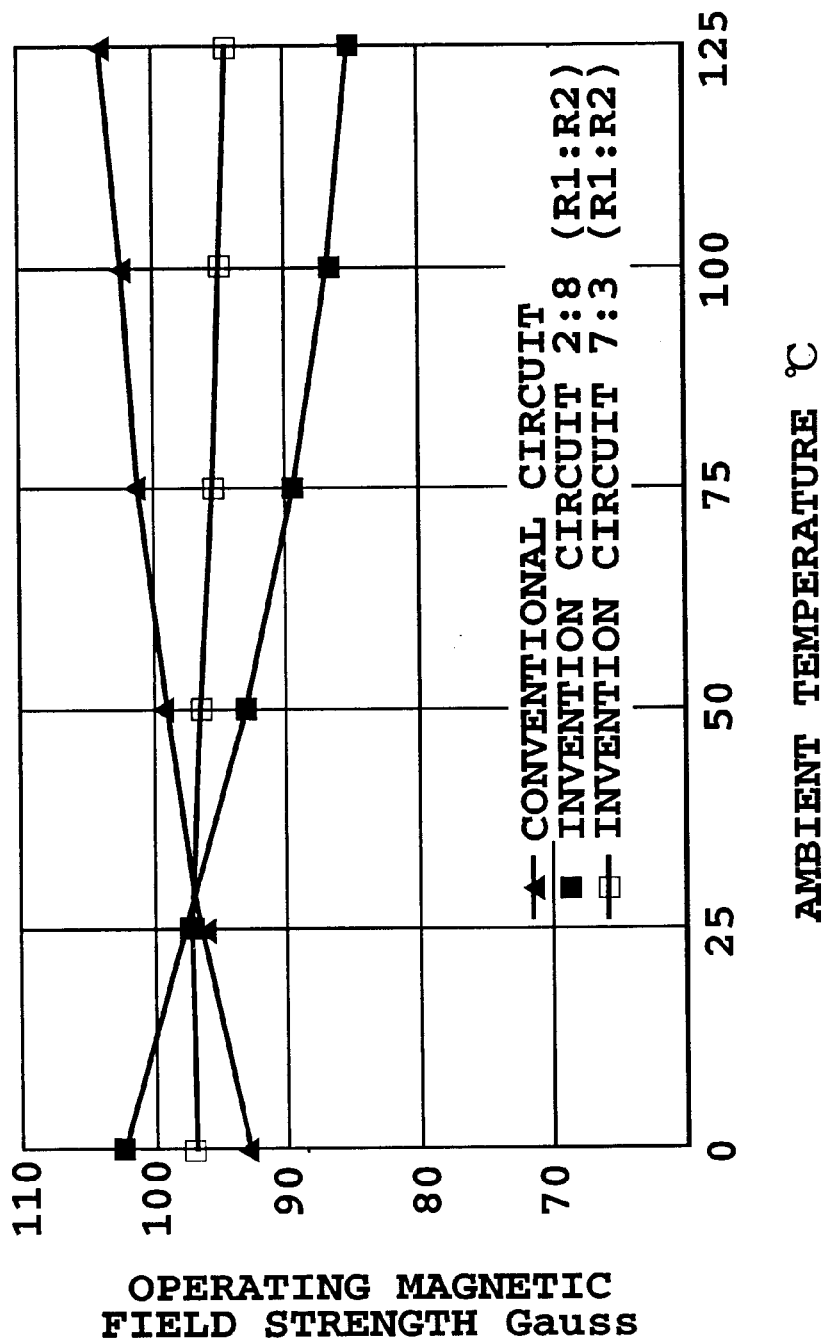
FIG. 7 is a graph showing the results of comparing the dependence of operating magnetic flux density on temperature when carrying out the digital signal processing using the circuit in accordance with the present invention and a circuit for comparison.

FIG. 7 comparatively shows the temperature dependence of the operating magnetic flux density (Bop) obtained by using the InAs Hall element 4 as the sensor in the circuit as shown in FIG. 2, which was implemented in the form of the Si monolithic IC.

FIG. 7 shows the results of experiments in which the temperature coefficient of the resistor R1 was set at 2000 ppm/° C., that of the other resistor R2 was set at 7000 ppm/° C., and the ratio of R1 and R2 was set at 2:8 or 7:3.

Figure 13:
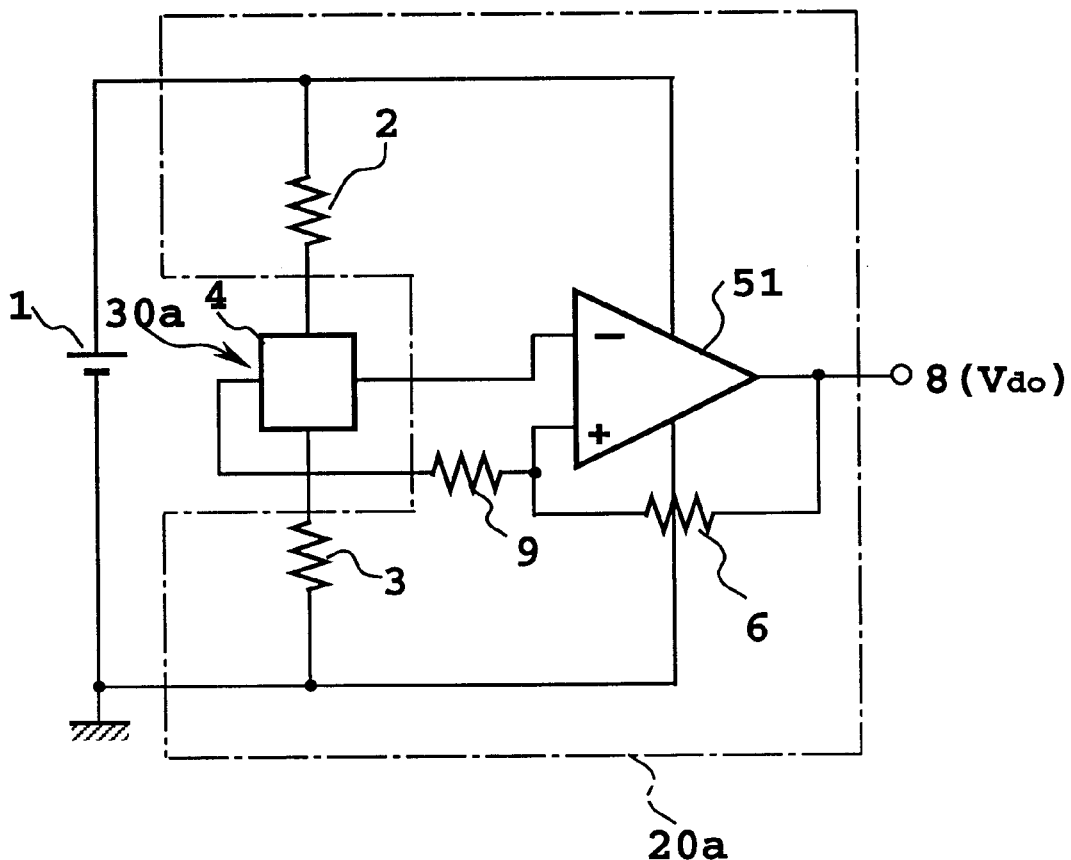
FIG. 13 is a diagram showing another conventional signal processing circuit for comparison.
Figure 14:
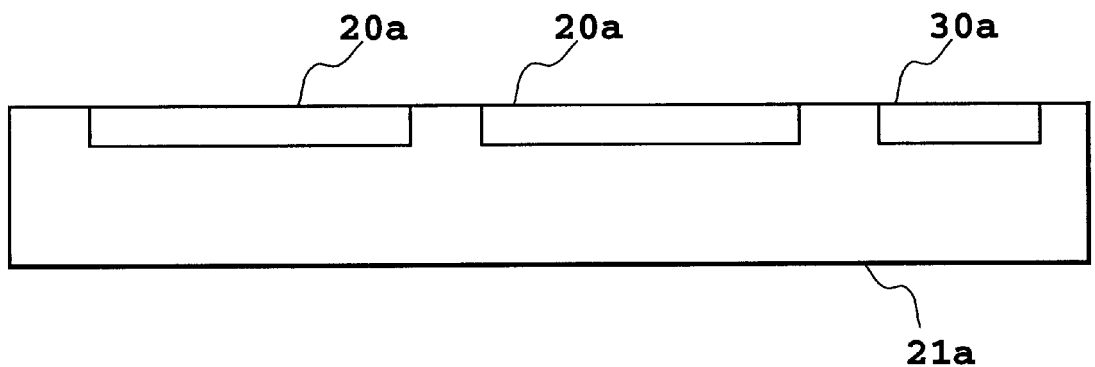
FIG. 14 is a cross-sectional view showing a substrate structure of the signal processing section of a conventional circuit.
Figure 15:
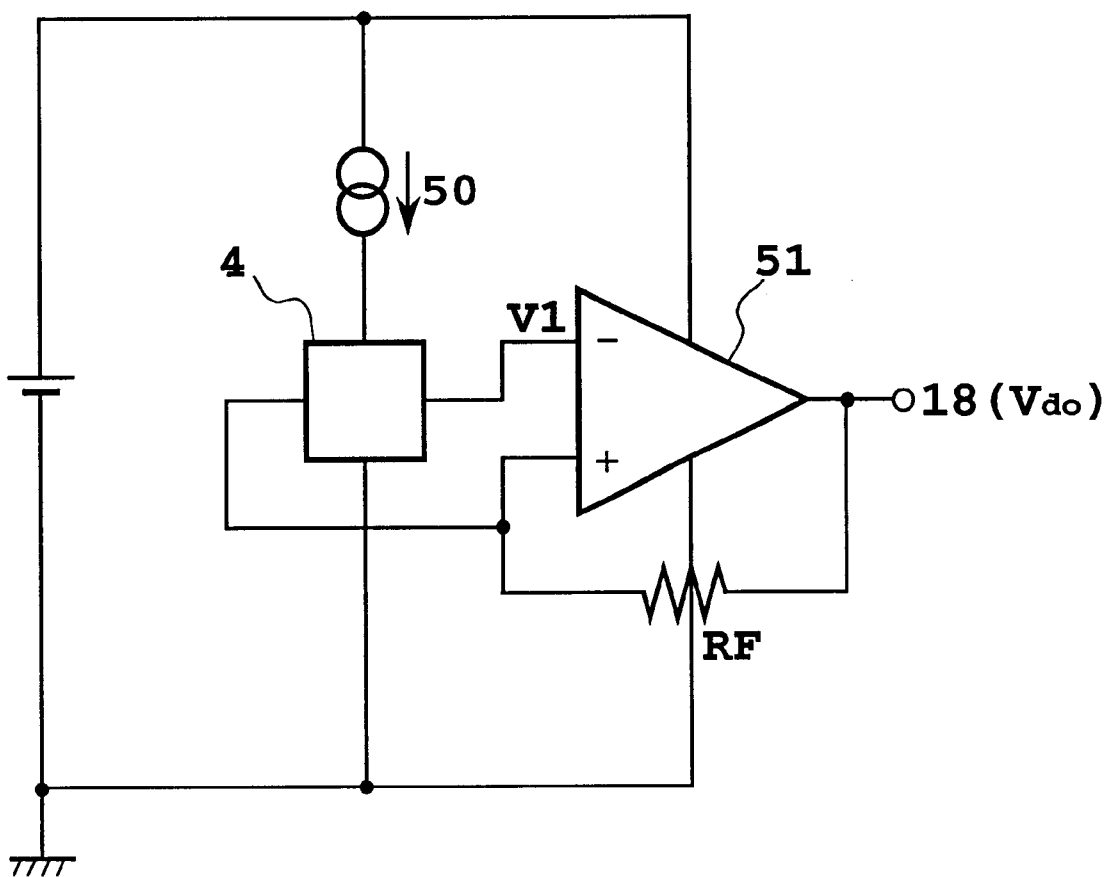
FIG. 15 is a diagram showing a still another conventional signal processing circuit for comparison.

For comparison, the temperature dependence of the operating magnetic flux density (Bop) is also illustrated which was obtained by using the InAs Hall element 4 as a sensor in the circuit as shown in FIG. 13.

Using the digital output circuit in accordance with the present invention can establish the temperature coefficient of the operating magnetic flux density at approximately zero in a wide temperature range when the ratio of R1 and R2 is 7:3. Furthermore, in the case where the ratio of R1 and R2 is 2:8, the temperature coefficient can be set at −0.18%/° C., which is the same as the temperature coefficient of a common ferrite magnet. Thus, when detecting the magnetic field formed by the ferrite magnet, the temperature dependence of the sensor output can be reduced to approximately zero by designing the ratio of R1 and R2 at 2:8.

Moreover, since the resistor R1 was formed using a common resistance whose sheet resistance is rather small in the Si integrated circuit, and the resistor R2 was formed using a resistance whose sheet resistance is comparatively large to create the high resistance, the circuit configuration in accordance with the present invention can obviate the necessity for preparing the resistors with special temperature coefficients that match the temperature coefficients of the sensitivity and resistance of the InAs Hall element because the resistors can be implemented by combining the values of the two types of the resistors formed through the common process. This offers an advantage of being able to implement the IC circuit at low cost without adding any special process to the IC fabrication.

Experimental Example 2

Figure 9:
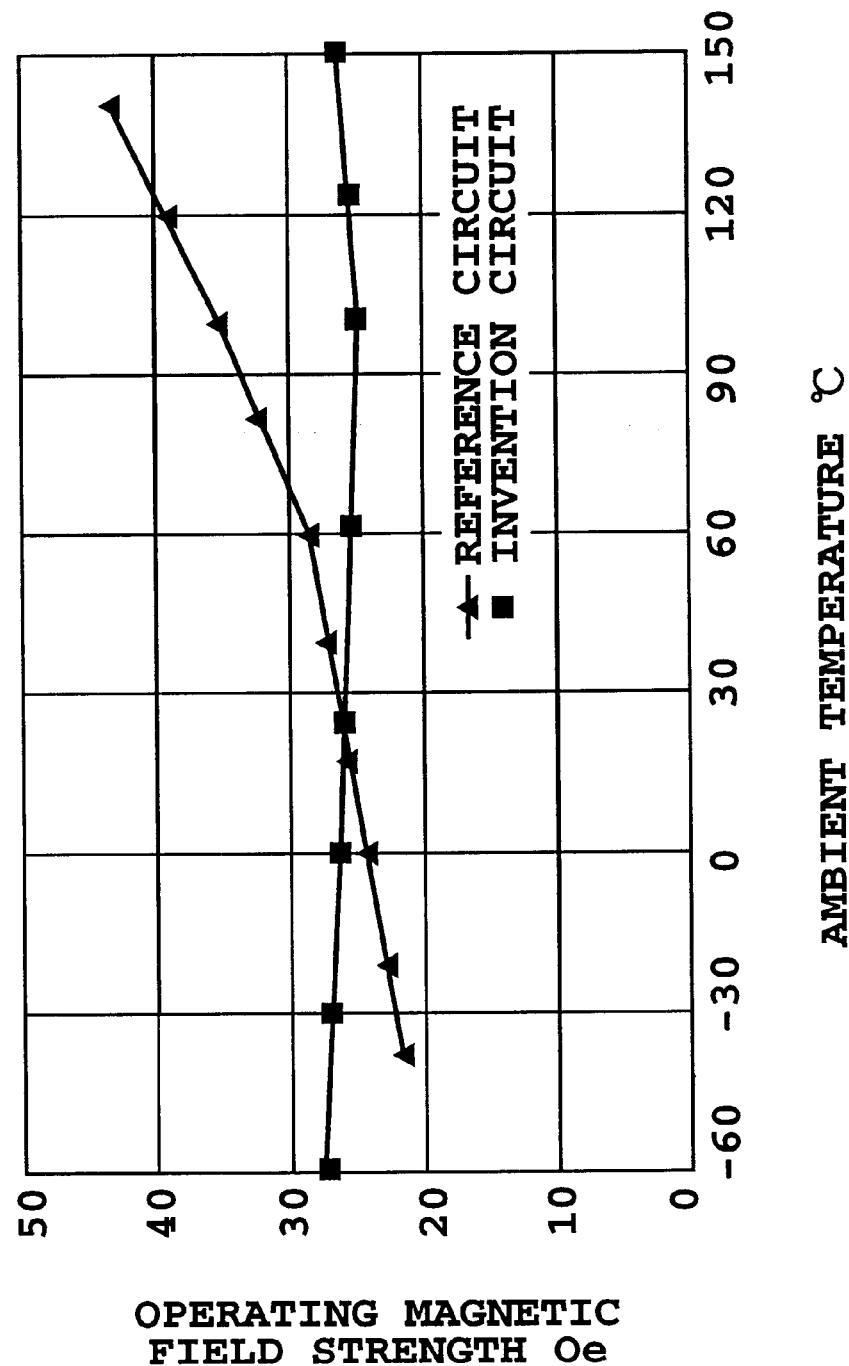
FIG. 9 is a graph showing the results of comparing the dependence of the operating magnetic flux density on temperature when carrying out the digital signal processing using the circuit in accordance with the present invention and a circuit for comparison.

FIG. 9 also comparatively illustrates the temperature dependence of the operating magnetic field strength (Hop) obtained by using the magnetic thin film magnetoresistive element (NiFe) as the sensor in the circuit as shown in FIG. 2 implemented in the form of the Si monolithic IC, and in the circuit of FIG. 13 used as a reference.

It is seen from the graph that the temperature coefficient of the operating magnetic field strength can be set approximately zero in a wide temperature range.

Experimental Example 3

Figure 10:
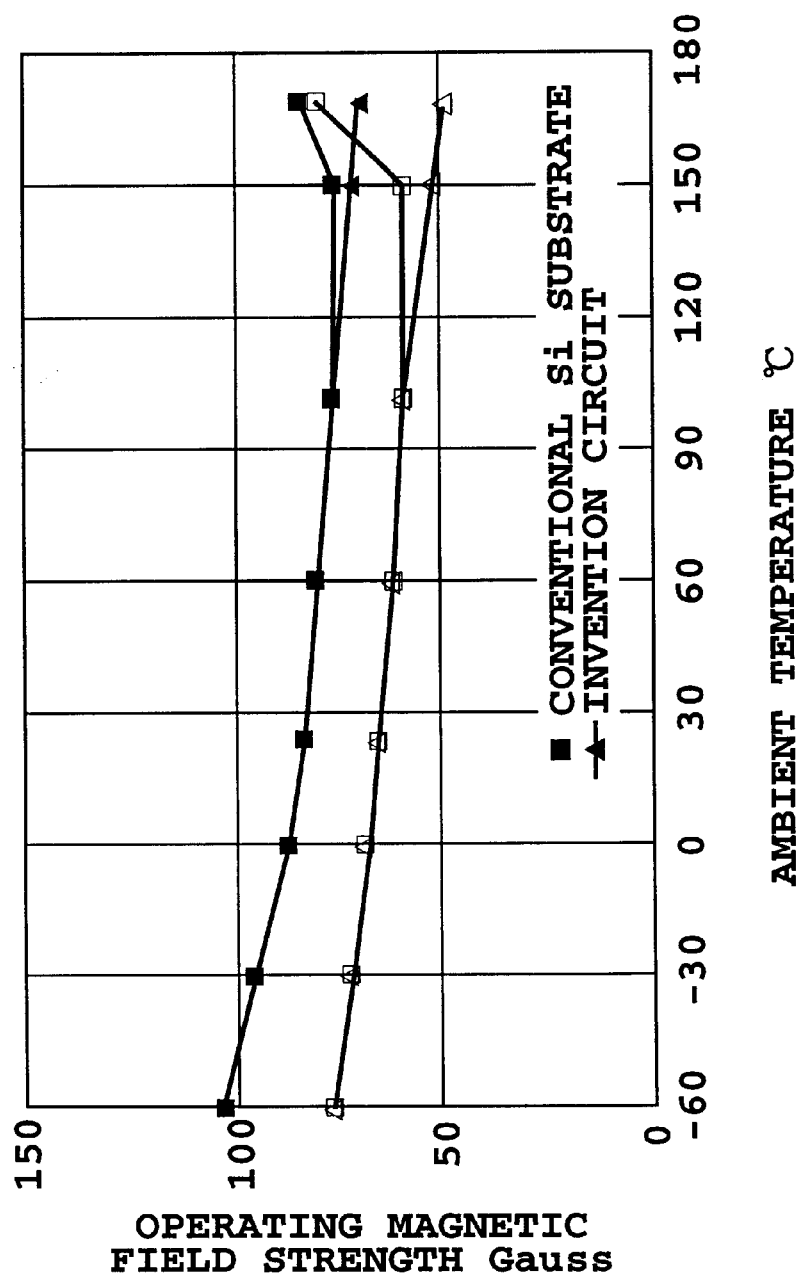
FIG. 10 is a characteristic diagram illustrating the dependence of the operating magnetic flux density on temperature when comparing that of the signal processing circuit in accordance with the present invention formed on a ceramic substrate with that of a common Si integrated circuit.

FIG. 10 illustrates the temperature dependence of the operating magnetic flux density in the case of FIGS. 11A and 11B, in which the signal processing circuit as shown in FIG. 2 was formed on the ceramic substrate in comparison with the temperature coefficient of a corresponding integrated circuit formed on a common conventional Si substrate. As seen from FIG. 10, the operating magnetic flux density of the circuit in accordance with the present invention was stable in the ambient temperature above 150° C.

As described above, the magnetic sensor section, which is composed of the compound semiconductor thin film, combined with the constant current circuit for feeding back the current can prevent the reduction in the yield due to the variations in the midpoint potential of the Hall element, or to the variations in the resistors of the circuit.

In addition, the temperature dependence of the operating magnetic flux density can be reduced to approximately zero by setting the temperature coefficient of the feedback current by the constant current circuit at a value inversely proportional to the temperature coefficient of the combined resistance of the plurality of resistors with two or more different temperature coefficients in the signal processing circuit. This also makes it possible to obtain the sensor output that is independent of the temperature in a wide temperature range, even if the magnetic field to be detected has the temperature dependence as in the detection of the magnetic field of a permanent magnet.

Moreover, the integrated circuit of the signal processing circuit section which is formed on the insulated ceramic substrate ensures the stable operation in high ambient temperatures.

What is claimed is:

1. A magnetic sensor with a signal processing circuit, comprising:
   a magnetic sensor section comprising one of a compound semiconductor thin film and a magnetic thin film;
   an operational amplifier having a non-inverting input terminal, an inverting input terminal and output terminal, said operational amplifier amplifies an electrical output detected by said magnetic sensor section as a magnetic signal; and
   a constant current circuit responsive to an output of said operational amplifier for feeding a current from said constant current circuit back to said non-inverting input terminal of said operational amplifier.

2. The magnetic sensor with a signal processing circuit as claimed in claim 1, wherein said constant current circuit includes a plurality of resistors with at least two different temperature coefficients, and wherein the current that said constant current circuit outputs has a temperature coefficient which is inversely proportional to a temperature coefficient of a combined resistance of the plurality of the resistors.

3. The magnetic sensor with a signal processing circuit as claimed in claim 2, wherein the combined resistance has a temperature coefficient which corrects a temperature coefficient of an internal resistance of said magnetic sensor section and a temperature coefficient of sensitivity of said magnetic sensor section.

4. The magnetic sensor with a signal processing circuit as claimed in claim 3, wherein the combined resistance has temperature coefficients which further corrects a temperature coefficient of an object to be detected by said magnetic sensor section.

5. A magnetic sensor with a signal processing circuit, comprising:
   a magnetic sensor section comprising one of a compound semiconductor thin film and a magnetic thin film; and
   a signal processing circuit for processing an electrical output detected by said magnetic sensor section, wherein said signal processing circuit comprising an operational amplifier having a non-inverting input terminal, an inverting input terminal and output terminal, said operational amplifier amplifying said electrical output, and a constant current circuit responsive to an ouput of said operational amplifier for feeding a current from said constant current circuit back to said non-inverting input terminal of said operational amplifier; and wherein said signal processing circuit is a monolithic circuit.

6. The magnetic sensor with a signal processing circuit as claimed in claim 5, wherein said signal processing circuit is formed on one of an insulated substrate and an insulating layer formed on a semiconductor substrate.

7. The magnetic sensor with a signal processing circuit as claimed in claim 6, wherein said constant current circuit includes a plurality of resistors with at least two different temperature coefficients, and wherein the current that said constant current circuit outputs has a temperature coefficient which is inversely proportional to a temperature coefficient of a combined resistance of the plurality of the resistors.

8. The magnetic sensor with a signal processing circuit as claimed in claim 7, wherein the combined resistance has a temperature coefficient which corrects a temperature coefficient of an internal resistance of said magnetic sensor section and a temperature coefficient of sensitivity of said magnetic sensor section.

9. The magnetic sensor with a signal processing circuit as claimed in claim 8, wherein the combined resistance has temperature coefficients which further corrects a temperature coefficient of an object to be detected by said magnetic sensor section.

10. The magnetic sensor with a signal processing circuit as claimed in claim 5, wherein said magnetic sensor section is Hall effect device.

11. The magnetic sensor with a signal processing circuit as claimed in claim 6, wherein said magnetic sensor section is Hall effect device.

* * * * *